(12) United States Patent
Hashitani

(10) Patent No.: US 8,643,093 B2
(45) Date of Patent: Feb. 4, 2014

(54) SEMICONDUCTOR DEVICE AND METHOD OF MANUFACTURING THE SAME

(75) Inventor: Masayuki Hashitani, Chiba (JP)

(73) Assignee: Seiko Instruments Inc. (JP)

( * ) Notice: Subject to any disclaimer, the term of this patent is extended or adjusted under 35 U.S.C. 154(b) by 296 days.

(21) Appl. No.: 13/199,283

(22) Filed: Aug. 24, 2011

(65) Prior Publication Data

US 2012/0049275 A1 Mar. 1, 2012

(30) Foreign Application Priority Data

Aug. 30, 2010 (JP) .................................. 2010-192634

(51) Int. Cl.
*H01L 21/00* (2006.01)

(52) U.S. Cl.
USPC ............................. 257/330; 257/329; 438/301

(58) Field of Classification Search
USPC ............................. 438/301, 270; 257/329–330
See application file for complete search history.

(56) References Cited

U.S. PATENT DOCUMENTS

| | | | | |
|---|---|---|---|---|
| 6,624,469 | B1 * | 9/2003 | Harada | 257/330 |
| 6,635,532 | B2 * | 10/2003 | Song et al. | 438/259 |
| 6,924,198 | B2 * | 8/2005 | Williams et al. | 438/270 |
| 7,052,963 | B2 * | 5/2006 | Williams et al. | 438/268 |
| 7,230,297 | B2 * | 6/2007 | Ono et al. | 257/330 |
| 2002/0132425 | A1 * | 9/2002 | Song et al. | 438/257 |
| 2002/0168821 | A1 * | 11/2002 | Williams et al. | 438/268 |
| 2004/0185622 | A1 * | 9/2004 | Williams et al. | 438/270 |
| 2004/0191994 | A1 * | 9/2004 | Williams et al. | 438/270 |
| 2007/0194372 | A1 * | 8/2007 | Ono et al. | 257/329 |
| 2008/0079081 | A1 * | 4/2008 | Hashimoto | 257/363 |
| 2008/0224252 | A1 * | 9/2008 | Suguro et al. | 257/499 |
| 2010/0176443 | A1 * | 7/2010 | Takaishi | 257/328 |
| 2012/0001254 | A1 * | 1/2012 | Kronholz et al. | 257/327 |
| 2012/0049275 | A1 * | 3/2012 | Hashitani | 257/330 |
| 2012/0267710 | A1 * | 10/2012 | Takaishi | 257/330 |
| 2013/0001681 | A1 * | 1/2013 | Sin et al. | 257/330 |
| 2013/0037881 | A1 * | 2/2013 | Mizokuchi et al. | 257/330 |

FOREIGN PATENT DOCUMENTS

| | | |
|---|---|---|
| JP | 10032331 | 2/2008 |
| JP | 2008034794 | 2/2008 |

* cited by examiner

*Primary Examiner* — Laura Menz

(74) *Attorney, Agent, or Firm* — Adams & Wilks

(57) ABSTRACT

Provided is a semiconductor device that includes a vertical MOS transistor having a trench structure capable of enhancing a driving performance of the vertical MOS transistor. A thick oxide film is formed next to a gate electrode led out of a trench of the vertical MOS transistor having the trench structure, and is removed to form a stepped portion which has a face lower than a surrounding plane and has slopes as well. This makes it possible to form a heavily doped diffusion layer right under the gate electrode through ion implantation for forming a heavily doped source diffusion layer, thereby solving a problem of no current flow in a part of a driver element and enhancing the driving performance of the vertical MOS transistor.

4 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a vertical MOS transistor with a trench structure and a method of manufacturing the semiconductor device.

2. Description of the Related Art

In recent years, power supply ICs represented by voltage regulators and voltage detectors tend to be smaller in chip size and larger in output current to keep up with the size reduction and diversification of portable devices to which the power supply ICs are mounted. Since a driver element for driving a current occupies the chip area most within elements constituting a power supply IC, MOS transistors having a trench structure have been employed so far in an attempt to enhance the driving performance of the driver element through reduction in area and increase in the effective channel width.

Up to now, semiconductor devices having a trench structure and methods of manufacturing the semiconductor devices have been introduced in, for example, JP 10-32331 A and JP 2008-34794 A.

A conventional method of manufacturing a vertical MOS transistor having a trench structure is described with reference to FIGS. 4A to 5D. FIGS. 4A to 5D are schematic sectional views illustrating step by step the flow of the manufacturing method.

First, as illustrated in FIG. 4A, a first conductivity type well diffusion layer 22 (called a body) is formed on a second conductivity type embedded layer 21. A thermally oxidized film 23, a deposited oxide film 24, and a resist film 25 are stacked on a surface of the body and are partially etched away.

Next, as illustrated in FIG. 4B, the resist film 25 is removed and then a hard mask which is a laminate of the patterned thermally oxidized film 23 and deposited oxide film 24 is used to form a trench 26 by etching. Subsequently, as illustrated in FIG. 4C, the thermally oxidized film 23 and the deposited oxide film 24 which have been used as the hard mask are removed and then a sacrificial oxide film 27 is formed by thermal oxidation in order to improve the shape of the trench 26.

Thereafter, as illustrated in FIG. 4D, removing the sacrificial oxide film 27, a gate insulating film 28 is formed by thermal oxidation, and a doped polycrystalline silicon film 29 which contains impurities formed by deposition.

Next, as illustrated in FIG. 5A, a resist film 31 is used in patterning and a gate electrode 30 is obtained by over-etching the doped polycrystalline silicon film 29.

Thereafter, as illustrated in FIG. 5B, a resist film 32 is patterned and the exposed surface is doped with second conductivity type impurities in order to form a source region. Subsequently, as illustrated in FIG. 5C, a resist film 33 is newly patterned and the exposed surface is doped with first conductivity type impurities in order to form a substrate-potential region.

Thereafter, as illustrated in FIG. 5D, a second conductivity type heavily doped source diffusion layer 34 and a first conductivity type heavily doped substrate-potential diffusion layer 35 are formed by heat treatment. An interlayer insulating film 36 is subsequently formed by deposition, and then contact holes 37 are formed to establish electrical connection to the gate electrode 30, the second conductivity type heavily doped source diffusion layer 34, and the first conductivity type heavily doped substrate-potential diffusion layer 35. Plugs made of tungsten or the like are then embedded to form source substrate-potential wiring 39 and gate-potential wiring 38.

An element structure that has the trench 26 formed in the first conductivity type well diffusion layer 22 is thus formed as a vertical MOS transistor having a trench structure which operates in the vertical direction.

However, the conventional semiconductor device manufacturing method described above has a problem in that, when the contact holes are provided in the gate electrode led out of the trench of the vertical MOS transistor having a trench structure, a current does not flow in a part of the element because a heavily doped diffusion layer is not formed in the substrate right under the gate electrode.

SUMMARY OF THE INVENTION

The present invention has been made in view of the above, and an object of the present invention is therefore to provide a method of manufacturing a semiconductor device capable of solving the problem of no current flow in a part of a driver element and enhancing the driving performance of the driver element even more by: forming a thick oxide film next to a gate electrode that is led out of a trench of a vertical MOS transistor having a trench structure; removing the thick oxide film to form a stepped portion which has a face lower than a surrounding plane and has slopes as well; and utilizing the stepped portion to form a heavily doped diffusion layer right under the gate electrode through ion implantation for forming a heavily doped source diffusion layer.

In order to solve the above-mentioned problem, a semiconductor device and a method of manufacturing the semiconductor device according to the present invention are structured as follows.

(1) There is provided a semiconductor device that includes a vertical MOS transistor including: a semiconductor substrate in which a first conductivity type well diffusion layer is formed in a part of a first conductivity type epitaxial layer having a second conductivity type embedded layer in a first conductivity type semiconductor substrate; a trench structure obtained by embedding a gate electrode in a trench with a gate insulating film interposed between the trench and the gate electrode, the trench being formed to a depth that reaches the second conductivity type embedded layer from a surface of the substrate; a second conductivity type heavily doped source diffusion layer and a first conductivity type substrate-potential diffusion layer which are formed above island-like regions, the island-like regions being other regions of the first conductivity type well diffusion layer than the trench structure; contact holes and wiring provided on an exposed surface portion to lead the gate electrode out of the trench structure via the gate insulating film and to thereby establish electrical connection; and wiring that is in contact in common with the second conductivity type heavily doped source diffusion layer and the first conductivity type substrate-potential diffusion layer which are formed on the island-like regions, to thereby operate with side surfaces of the trench structure as channels, and in the semiconductor device, a second conductivity type heavily doped source diffusion layer is formed right under the gate electrode by forming a thick oxide film next to the gate electrode led out of the trench, then removing the thick oxide film, and thus forming a stepped portion which is lower than a surrounding plane and which has slopes.

(2) There is provided a method of manufacturing the semiconductor device, including forming the thick oxide film which is an embedded oxide film by Shallow Trench Isolation (STI).

(3) There is provided a method of manufacturing the semiconductor device, including forming the second conductivity type heavily doped source diffusion layer that is formed right under the gate electrode by one of spin implantation and step implantation.

(4) In the semiconductor device, the trench structure in the first conductivity type well diffusion layer forms one of a lattice pattern and a stripe pattern.

As described above, according to the present invention, a thick oxide film is formed next to a gate electrode led out of a trench of a vertical MOS transistor having a trench structure, and is removed to form a stepped portion which has a face lower than a surrounding plane and has slopes as well. This makes it possible to form a heavily doped diffusion layer right under the gate electrode through ion implantation for forming a heavily doped source diffusion layer, thereby solving the problem of no current flow in a part of a driver element and enhancing the driving performance of the driver element. The semiconductor device and the semiconductor device manufacturing method that are provided by the present invention are also capable of eliminating the fear of an increase in gate electrode impedance in AC operation which is caused by a width reduction of a part of the gate electrode when the heavily-doped source diffusion layer is to be formed right under the gate electrode.

DETAILED DESCRIPTION OF THE PREFERRED EMBODIMENTS

An embodiment of the present invention is described below with reference to the drawings. FIGS. 1A to 2D are schematic sectional views illustrating a flow of a semiconductor device manufacturing method according to the embodiment of the present invention. The schematic sectional views illustrating the flow are sectional views taken along the line B-B' of FIG. 3B, which is a plan view of an element obtained by the semiconductor device manufacturing method of the present invention.

Figure 1A:
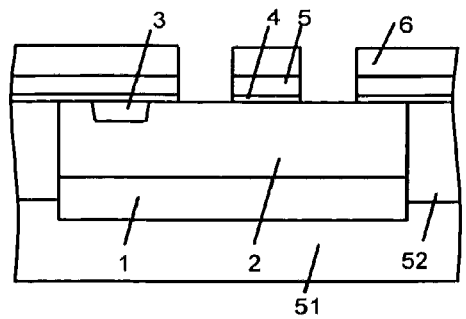
FIGS. 1A to 2D are schematic sectional views illustrating a process flow according to an embodiment of the present invention.

FIG. 1A illustrates a substrate after forming of a hard mask for trench etching has been finished. The substrate includes a first conductivity type semiconductor substrate 51 which is, for example, a P-type semiconductor substrate doped with boron at an impurity concentration that gives the semiconductor substrate a resistivity of 20 Ωcm to 30 Ωcm. As a second conductivity type embedded layer 1, an N-type embedded layer in which impurities such as arsenic, phosphorus, or antimony are diffused at a concentration of, for example, approximately $1\times10^{16}$ atoms/cm$^3$ to $1\times10^{18}$ atoms/cm$^3$ is selectively formed in the first conductivity type semiconductor substrate 51. A first conductivity type epitaxial layer 52 is also grown on the first conductivity type semiconductor substrate 51 to a thickness of, for example, several μm to several tens μm. In a region of the substrate where a trench structure is to be formed later, a first conductivity type well diffusion layer 2 (called a body) is formed by ion implantation of impurities such as boron or boron difluoride at a dose of, for example, $1\times10^{12}$ atoms/cm$^2$ to $1\times10^{13}$ atoms/cm$^2$. In the case where the second conductivity type embedded layer 1 is a P-type embedded layer, for example, the embedded layer is doped with boron or similar impurities to the concentration given above. What conductivity types the semiconductor substrate 51, the embedded layer 1, and the epitaxial layer 52 have are irrelevant to the essence of the present invention. The semiconductor substrate 51 and the epitaxial layer 52 are omitted from FIGS. 1B to 2D.

A thick oxide film 3, which is one of the characteristics of the present invention, is provided in a part of a surface of the first conductivity type well diffusion layer 2 in the region where the trench structure is to be formed later. The thick oxide film 3 is, for example, such an embedded oxide film as the one used in Shallow Trench Isolation (STI) for element isolation which has a thickness of several hundreds nm. In order to form the hard mask for trench etching, a thermally oxidized film 4 having a thickness of, for example, several tens nm to several hundreds nm and a deposited oxide film 5 having a thickness of, for example, several hundreds nm to 1 μm are stacked on a surface of the first conductivity type well diffusion layer 2, and are selectively removed by etching with a resist film 6 as a pattern to form openings. The hard mask may have a single-layer structure constituted of a thermally oxidized film or a deposited oxide film if the single-layer structure withstands satisfactorily against the subsequent trench etching. As the hard mask, a resist film or a nitride film can also be used without a problem.

Figure 1B:
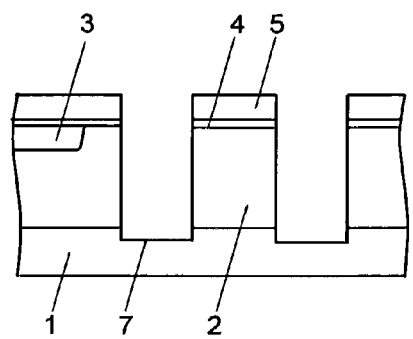
Figure 3A:
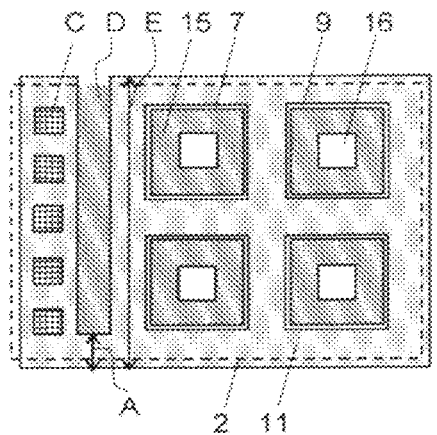
FIGS. 3A to 3C are characteristic plan views of the embodiment illustrating the characteristics of the present invention.
Figure 3B:
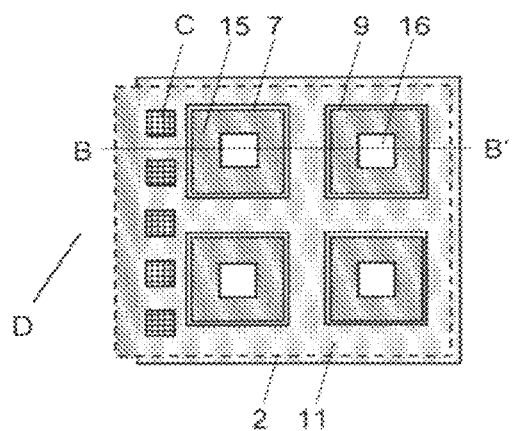
Figure 3C:
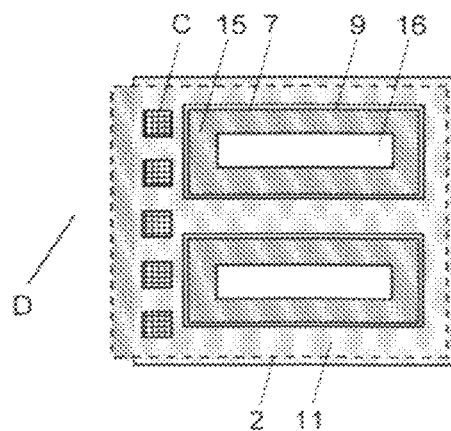
Figure 4A:
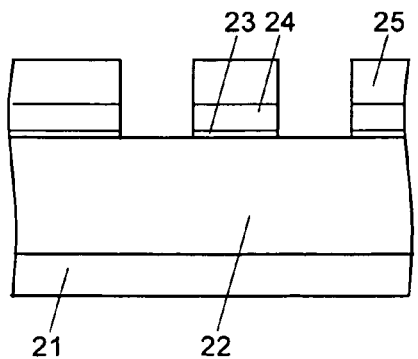
FIGS. 4A to 5D are schematic sectional views illustrating a flow of a conventional manufacturing method.
Figure 4B:
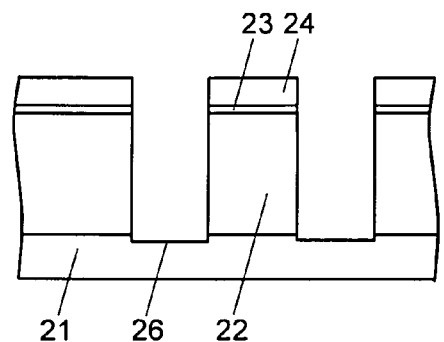
Figure 4C:
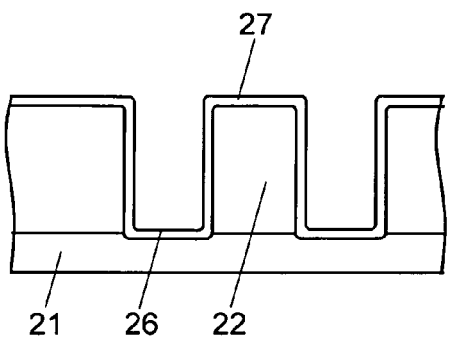
Figure 4D:
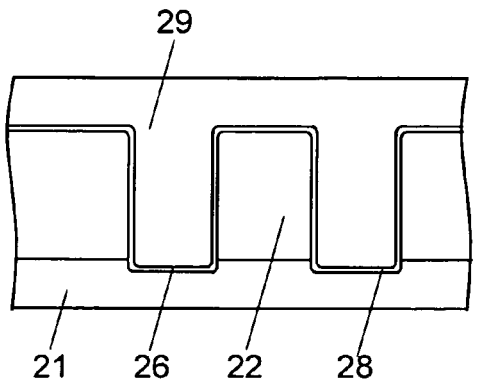
Figure 5A:
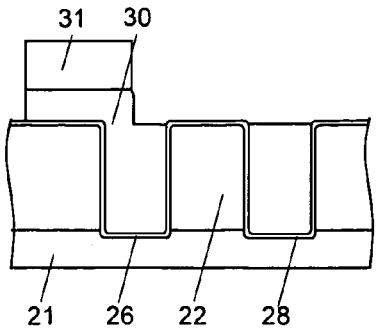
Figure 5B:
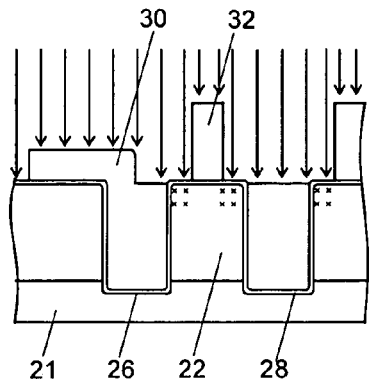
Figure 5C:
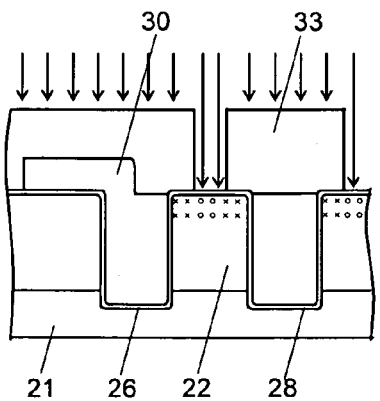
Figure 5D:
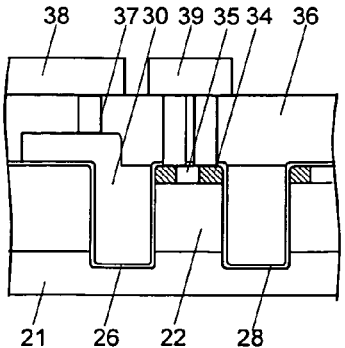

Next, as illustrated in FIG. 1B, the resist film 6 is removed and a trench 7 is formed by etching with the use of the hard mask which is a laminate of the patterned thermally oxidized film 4 and deposited oxide film 5. The trench 7 is preferably deep enough to reach the second conductivity type embedded layer 1. The trench 7 and other trenches 7 together form a lattice pattern or a stripe pattern in plan view as illustrated in FIGS. 3B and 3C. Accordingly, regions where no trenches are formed are island-like regions in plan view which are isolated like islands, and are surrounded by trenches.

Figure 1C:
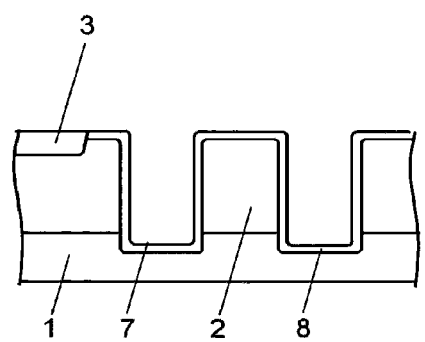
Figure 1D:
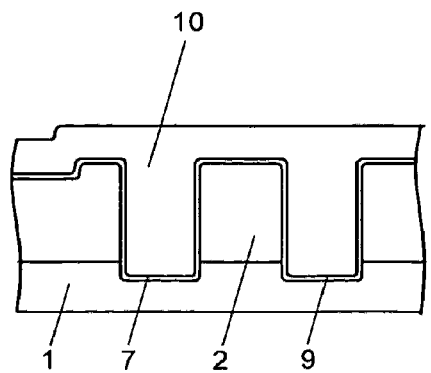

Subsequently, as illustrated in FIG. 1C, the thermally oxidized film 4 and the deposited oxide film 5 which have been used as the hard mask are removed, and then a sacrificial oxide film 8 is formed by thermal oxidation to a thickness of, for example, several nm to several tens nm in order to improve the shape of the trench 7. Thereafter, as illustrated in FIG. 1D, the sacrificial oxide film 8 is removed and the thick oxide film 3 is simultaneously removed. The region from which the thick oxide film 3 has been removed, which is one of the characteristics of the present invention, is now a stepped portion which is lower than the surrounding plane and which has slopes. A gate insulating film 9, for example, a thermally oxidized film having a thickness of several hundreds Å to several thousands Å is subsequently formed. A doped polycrystalline silicon film 10 is then formed by deposition to a thickness of, preferably, 100 nm to 500 nm, filling the trench 7 with the polycrystalline silicon film 10. The conductivity type of the doped polycrystalline silicon film 10 can be the first conductivity type or the second conductivity type.

Figure 2A:
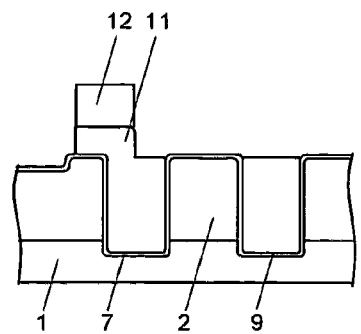

Next, as illustrated in FIG. 2A, a resist film 12 is used in patterning and the doped polycrystalline silicon film 10 is over-etched to obtain a gate electrode 11. The patterning in this step is performed in a manner that the gate electrode 11 does not cover the region from which the thick oxide film 3 has been removed, which is one of the characteristics of the present invention, and in a manner that an edge of the gate electrode 11 positions at an edge of the thick oxide film 3. The following description is given with reference to FIGS. 3A to 3C, too, which are plan views of elements. FIGS. 3A, 3B, and 3C each illustrate a vertical MOS transistor having a trench structure which is a basic cell integrated on the order of at least several hundreds to several thousands in a chip.

In FIGS. 3A, 3B, and 3C, a reference symbol C represents a contact hole for establishing electrical connection to the gate electrode 11. FIG. 3A illustrates a manufacturing method in which a second conductivity type heavily doped source diffusion layer 15 to be formed later in a manner indicated by a reference symbol D of FIG. 3A is formed by patterning the gate electrode 11 in a manner that makes the gate electrode narrow in a portion A of FIG. 3A. This method solves the problem of no current flow in a part of the element fairly well, but does not remove the fear of characteristics deterioration in AC operation due to an increase in gate electrode impedance. If the gate electrode 11 is widened in the portion A in order to lower the impedance, the second conductivity type heavily doped source region 15 is not formed right under the portion A of the gate electrode 11 and, consequently, a current does not flow in a part of the element.

In a semiconductor device of the present invention which is illustrated in the plan views of FIGS. 3B and 3C, on the other hand, the stepped portion which is created by the removal of the thick oxide film 3 and which has a face lower than the surrounding plane and has slopes as well is formed next to the gate electrode 11. This makes it possible to form the second conductivity type heavily doped source diffusion layer 15 right under the gate electrode 11, and solves the problem of no current in a part of the element, thereby enhancing the driving performance of the driver element without the need to reduce the width of a part of the gate electrode 11.

Figure 2B:
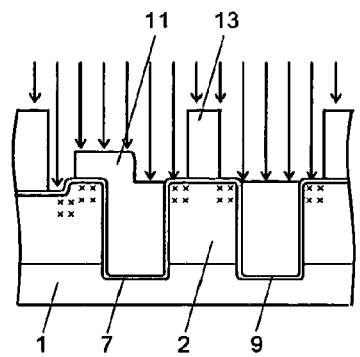
Figure 6:
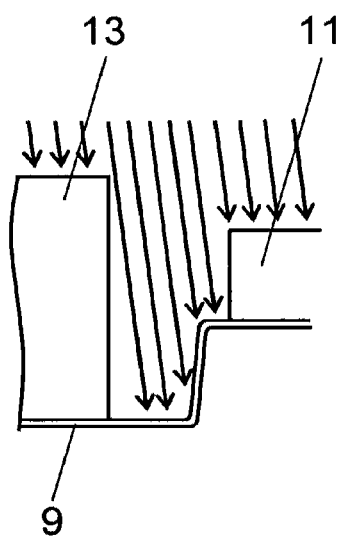
FIG. 6 is a diagram that supplements the sectional views of the process flow to illustrate the characteristics of the present invention.

Thereafter, as illustrated in FIG. 2B, a resist film 13 is patterned and the exposed surface is doped with second conductivity type impurities to form a source region. The doping uses ion implantation. As illustrated in FIG. 6, the ion implantation is accomplished through spin implantation or step implantation by slanting the semiconductor substrate with respect to ions being implanted, and ions are thus implanted below the gate electrode 11 from the stepped portion formed by the removal of the thick oxide film 3, which is one of the characteristics of the present invention, and having a face lower than the surrounding plane and having slopes as well.

Figure 2C:
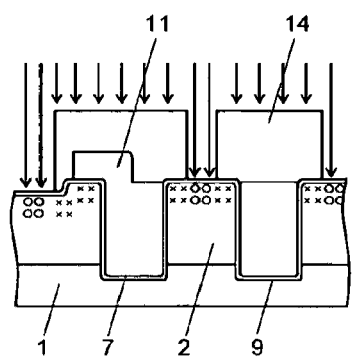

As illustrated in FIG. 2C, after the resist film 13 is removed, a resist film 14 is newly patterned and the exposed surface is doped with first conductivity type impurities to form a substrate-potential region. The doping uses ion implantation. In the ion implantation of FIGS. 2B and 2C, ions of, for example, arsenic or phosphorus are implanted preferably at a dose of $1\times10^{15}$ atoms/cm$^2$ to $1\times10^{16}$ atoms/cm$^2$ when the conductivity type of the surface on which the ion implantation is to be performed is the N-type. When the conductivity type of the surface on which the ion implantation is to be performed is the P-type, ions of boron or boron difluoride are implanted preferably at a dose of $1\times10^{15}$ atoms/cm$^2$ to $1\times10^{16}$ atoms/cm$^2$.

The doping of the source region and the substrate-potential region with impurities can be performed at the same time and under the same conditions as in the forming of MOS transistors in the same chip that do not have the trench 7.

Figure 2D:
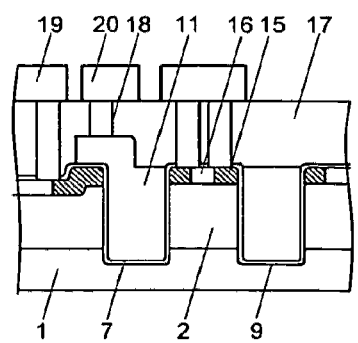

Thereafter, as illustrated in FIG. 2D, heat treatment is performed at 800° C. to 1,000° C. for several hours to form the second conductivity type heavily doped source diffusion layer 15 right under the gate electrode 11. A first conductivity type heavily doped substrate-potential diffusion layer 16 is also formed in the same manner as the heat treatment described above. An element structure that has the trench 7 formed in the first conductivity type well diffusion layer 2 is thus formed as a vertical MOS transistor having a trench structure which operates in the vertical direction.

Subsequently, an interlayer insulating film 17 having a thickness of, for example, several hundreds nm to 1 μm is laid on top and then contact holes 18 are formed to establish electrical connection to the gate electrode 11, the second conductivity type heavily doped source diffusion layer 15, and the first conductivity type heavily doped substrate-potential diffusion layer 16. Plugs made of tungsten or the like are then embedded to form source substrate-potential wiring 19 and gate-potential wiring 20.

In the manner described above, a thick oxide film formed next to a gate electrode led out of a trench is removed to form a stepped portion which is a characteristic of the present invention and which has a face lower than the surrounding plane and has slopes as well. The stepped portion makes it possible to form a heavily doped source diffusion layer right under the gate electrode by ion implantation. A semiconductor device and semiconductor device manufacturing method according to the present invention are thus capable of solving the problem of no current in a part of a driver element and enhancing the driving performance of the driver element.

What is claimed is:

1. A semiconductor device, comprising:
   a first conductivity type semiconductor substrate;
   a first conductivity type epitaxial layer provided on the first conductivity type semiconductor substrate with a second conductivity type embedded layer interposed between the first conductivity type semiconductor substrate and the first conductivity type epitaxial layer;
   a first conductivity type well diffusion layer formed in a part of the first conductivity type epitaxial layer on the second conductivity type embedded layer;
   trenches formed to a depth that reaches from the first conductivity type well diffusion layer to the second conductivity type embedded layer, and connected to one another in one of a lattice pattern and a stripe pattern;
   a gate insulating film formed on each surface of the trenches;
   a gate electrode filling each of the trenches which is covered with the gate insulating film;
   a first second-conductivity type heavily doped source diffusion layer and a first conductivity type substrate-potential diffusion layer which are formed above surfaces of island-like regions, the island-like regions being other regions of the first conductivity type well diffusion layer than the trenches;
   contact holes aligned on the gate electrode along one side of the gate electrode; and
   a second second-conductivity type heavily doped source diffusion layer provided in a stepped portion, the stepped portion being provided on a surface of the first conductivity type well diffusion layer that is in contact with the one side of the gate electrode along the one side of the gate electrode, and having a face lower than a surrounding plane and having slopes as well.

2. A semiconductor device, comprising:
   a substrate in which a first conductivity type well diffusion layer is formed in a part of a first conductivity type epitaxial layer having a second conductivity type embedded layer in a first conductivity type semiconductor substrate;
   a trench structure obtained by embedding a gate electrode in a trench with a gate insulating film interposed between the trench and the gate electrode, the trench being formed to a depth that reaches the second conductivity type embedded layer from a surface of the substrate;

a second conductivity type heavily doped source diffusion layer and a first conductivity type substrate-potential diffusion layer which are formed above island-like regions, the island-like regions being other regions of the first conductivity type well diffusion layer than the trench structure;

contact holes and wiring provided on an exposed surface portion to lead the gate electrode out of the trench structure via the gate insulating film and to thereby establish electrical connection;

wiring that is in contact in common with the second conductivity type heavily doped source diffusion layer and the first conductivity type substrate-potential diffusion layer which are formed on the island-like regions; and a second conductivity type heavily doped source diffusion layer right under the gate electrode which is formed in a stepped portion, the stepped portion being disposed next to the gate electrode, which is led out of the trench, and having a face lower than a surrounding plane and having slopes as well.

3. A method of manufacturing the semiconductor device of claim 1, comprising:
   forming the stepped portion by etching; and
   removing a thick oxide film which is an embedded oxide film formed by shallow trench isolation (STI).

4. A method of manufacturing the semiconductor device of claim 1, comprising:
   forming the second second-conductivity type heavily doped source diffusion layer that is formed right under the gate electrode is formed by ion implantation through one of spin implantation and step implantation.

* * * * *